(12) United States Patent
Yun et al.

(10) Patent No.: US 7,786,774 B2
(45) Date of Patent: Aug. 31, 2010

(54) PHASE SYNCHRONIZATION APPARATUS

(75) Inventors: Won-Joo Yun, Ichon (KR); Hyun-Woo Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/333,139

(22) Filed: Dec. 11, 2008

(65) Prior Publication Data

US 2009/0206895 A1   Aug. 20, 2009

(30) Foreign Application Priority Data

Feb. 14, 2008   (KR) .................. 10-2008-0013465

(51) Int. Cl.
  *H03L 7/06*   (2006.01)
(52) U.S. Cl. ..................... 327/156; 327/147
(58) Field of Classification Search ............. None
  See application file for complete search history.

(56) References Cited

U.S. PATENT DOCUMENTS

| | | | |
|---|---|---|---|
| 6,606,005 B2 | 8/2003 | Chang | |
| 6,642,747 B1 | 11/2003 | Chiu | |
| 6,859,109 B1 | 2/2005 | Leung et al. | |
| 7,129,789 B2* | 10/2006 | Hsiao et al. | 331/1 A |
| 7,230,458 B2* | 6/2007 | DaDalt | 327/113 |
| 7,288,997 B2 | 10/2007 | Chen | |
| 7,474,358 B2* | 1/2009 | Miyamoto | 348/723 |
| 7,567,132 B2* | 7/2009 | Thompson | 331/16 |
| 2006/0119405 A1 | 6/2006 | Kobayashi | |
| 2006/0197562 A1* | 9/2006 | Smith et al. | 327/156 |
| 2006/0197608 A1 | 9/2006 | Sanchez et al. | |
| 2006/0239338 A1* | 10/2006 | Kolanek et al. | 375/224 |
| 2006/0250192 A1 | 11/2006 | Hsieh | |

FOREIGN PATENT DOCUMENTS

| | | |
|---|---|---|
| JP | 2006074232 | 3/2006 |
| KR | 1019940001757 | 11/1994 |
| KR | 1020010021894 | 3/2001 |

* cited by examiner

*Primary Examiner*—Cassandra Cox
(74) *Attorney, Agent, or Firm*—Baker & McKenzie LLP

(57) ABSTRACT

A phase synchronization apparatus includes an oscillator gain setting member configured to discriminate a frequency by sequentially delaying input clock signal after dividing the input clock signal at a predetermined division ratio and to generate an oscillator gain setting signal by using discriminated frequency information, and a phase locked loop (PLL) circuit configured to oscillates output clock signal having a frequency corresponding to the oscillator gain setting signal in response to the input clock signal.

25 Claims, 8 Drawing Sheets

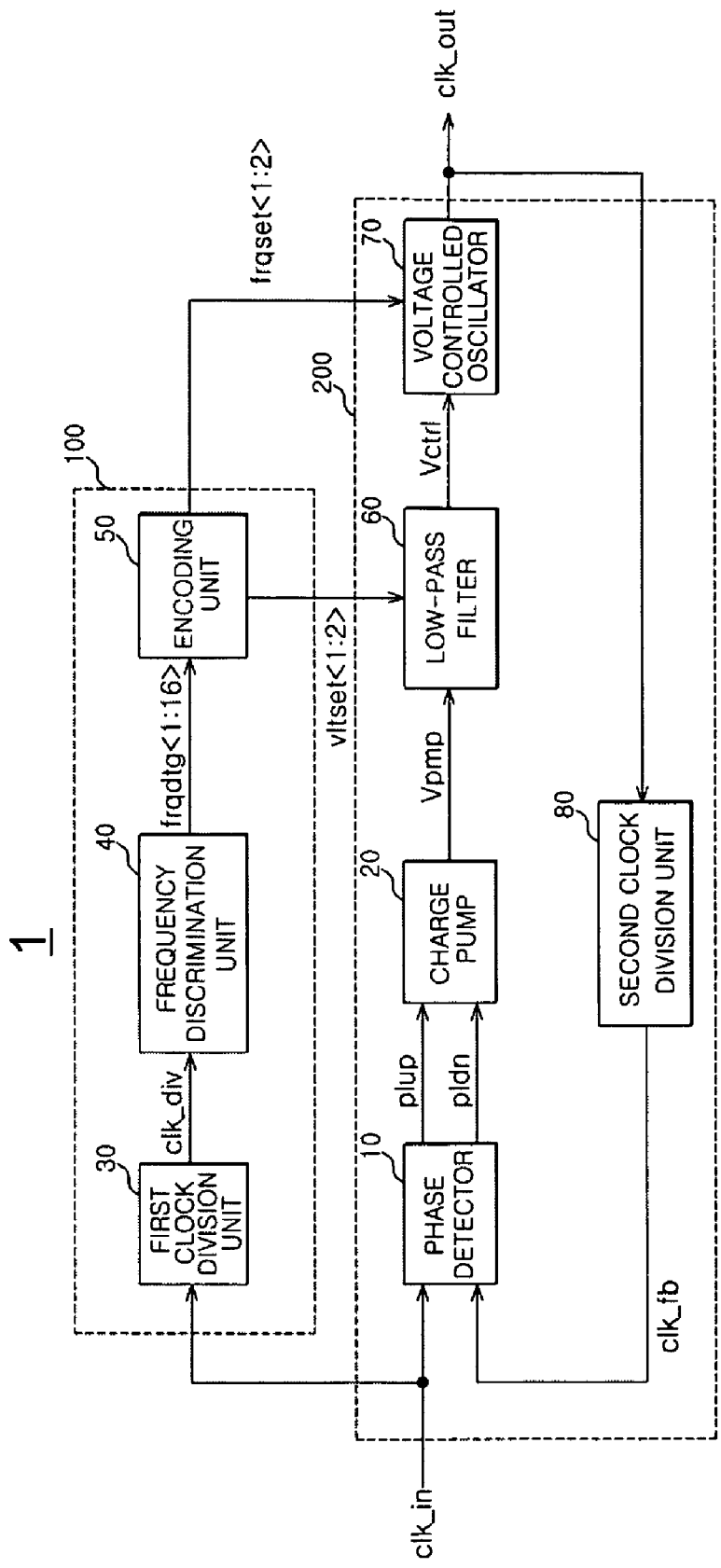

PHASE SYNCHRONIZATION APPARATUS

CROSS-REFERENCES TO RELATED PATENT APPLICATION

The present application claims priority under 35 U.S.C 119(a) to Korean Application No. 10-2008-0013465, filed on Feb. 14, 2008, in the Korean Intellectual Property Office, which is incorporated herein by reference in its entirety as if set forth in full.

BACKGROUND

1. Technical Field

The embodiments described herein relate to a phase synchronization apparatus, and more particularly, to a phase locked loop (PLL) circuit used in a semiconductor integrated circuit (IC) device.

2. Related Art

As operational speeds of semiconductor IC devices have gradually increased, frequencies of external clock signals used with such devices have also increased. As a result, frequencies of internal clock signals have also increased. Accordingly, conventional semiconductor IC devices often use a phase locked loop (PLL) circuit instead of a delayed locked loop (DLL) circuit as a clock phase synchronization apparatus in order to improve adaptability to high-frequency clock signals. The PLL circuit can be applied in various fields, such as a wired and wireless communication systems including RF systems, and is commonly used as, e.g., a phase controller, a frequency synchronizer, and a time-division system.

In general, the PLL circuit includes a phase detector, a charge pump, a low-pass filter, a voltage controlled oscillator (VCO), and a clock divider. Here, a gain of the VCO, i.e., a ratio of a control voltage to an output clock signal that is transmitted through a loop filter, is an important element for determining an operating characteristic of the PLL circuit. A conventional PLL circuit primarily uses a voltage controlled oscillator (VOC) having a large gain, which is intended to implement a phase fixing operation having short locking time. However, such a voltage controlled oscillator (VOC) having a large gain is problematic in that operational stability deteriorates because frequency band sensitively varies due to a change in voltage. Meanwhile, when a voltage controlled oscillator having a small gain is used in order to overcome this problem, the operational stability is improved, but the locking time is extended and an available frequency band is narrowed.

Accordingly, the operational performance of a conventional PLL circuit depends on the gain of the voltage controlled oscillator. Thus, operational stability in such a device is achieved using a voltage controlled oscillator having a large gain. Alternatively, a short locking time can be achieved by using the voltage controlled oscillator having a small gain. As conventional semiconductor integrated circuit devices are more commonly used in a high-speed environment, implementation of a high-performance clock phase synchronization apparatus is required. However, a conventional PLL circuit has the above-described technical problems when used in such an environment.

SUMMARY

A phase synchronization apparatus capable of stably operating while having a short locking time is disclosed herein.

In one aspect, a phase synchronization apparatus includes an oscillator gain setting member configured to discriminate a frequency by sequentially delaying an input clock signal after dividing the input clock signal at a predetermined division ratio and to generate an oscillator gain setting signal by using discriminated frequency information, and a phase locked loop (PLL) circuit configured to oscillates output clock signal having a frequency corresponding to the oscillator gain setting signal in response to the input clock signal.

In another aspect, a phase synchronization apparatus includes a first clock division unit configured to divide an input clock signal at a predetermined division ratio to generate a division clock signal, a frequency discrimination unit configured to perform an operation of sequentially delaying the division clock signal to generate a frequency discrimination signal containing frequency information of the input clock signal, an encoding unit configured to encode the frequency discrimination signal to generate a frequency setting signal, and a voltage controlled oscillator configured to oscillate an output clock signal in response to the frequency setting signal and a control voltage.

In still another aspect, a method for phase synchronization in a semiconductor device comprises dividing an input clock signal at a predetermined division ratio, discriminating a frequency by sequentially delaying the input clock signal, generating an oscillator gain setting signal using discriminated frequency information related to the sequentially delayed input clock signal, and generating output clock signal having a frequency corresponding to the oscillator gain setting signal in response to the input clock signal.

These and other features, aspects, and embodiments are described below in the section "Detailed Description."

BRIEF DESCRIPTION OF THE DRAWINGS

Features, aspects, and embodiments are described in conjunction with the attached drawings, in which:

FIG. 1 is a schematic block diagram of an exemplary phase synchronization apparatus according to one embodiment;

DETAILED DESCRIPTION

Figure 2B:
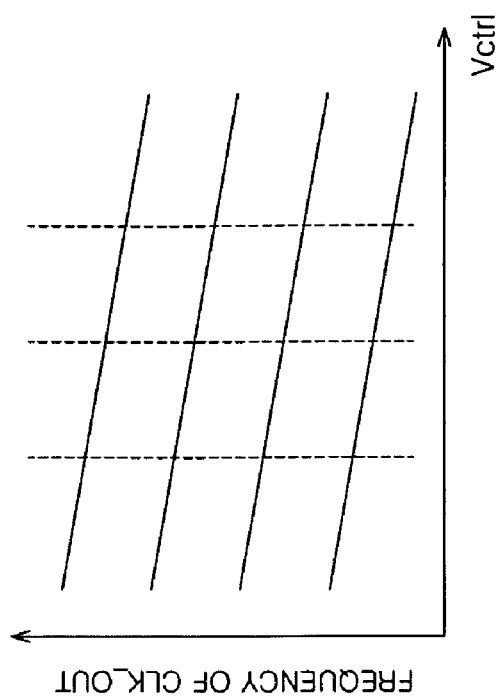
FIGS. 2A and 2B are graphs demonstrating an exemplary operation of the apparatus of FIG. 1 according to one embodiment.

FIG. 1 is a schematic block diagram of an exemplary phase synchronization apparatus 1 according to one embodiment.

In FIG. 1, the phase synchronization apparatus 1 can be configured to include an oscillator gain setting member 100 and a PLL circuit 200.

The PLL circuit 200 can include a phase detector 10, a charge pump 20, a low-pass filter 60, a voltage controlled oscillator 70, and a second clock division unit 80. The phase detector 10 can be configured to generate a pull-up control signal 'plup' and a pull-down control signal 'pldn' by comparing a phase of an input clock signal 'clk_in' with a phase of a feed-back clock signal 'clk_fb'. In addition, the charge pump 20 can perform a voltage pumping operation to generate a pumping voltage Vpmp in response to the pull-up control signal 'pulp' and the pull-down control signal 'pldn.'

The oscillator gain setting member 100 can include a first clock division unit 30 that generates a division clock signal 'clk_div' by dividing frequency of an input clock signal 'clk_in' at a predetermined division ratio, and a frequency discrimination unit 40 that can perform an operation of sequentially delaying the division clock signal 'clk_div' to generate first to sixteenth frequency discrimination signals 'frqdtg<1:16>' that contain frequency information of the input clock signal 'clk_in'. In addition, the oscillator gain setting member 100 can include an encoding unit 50 that can encode the first to sixteenth frequency discrimination signals 'frqdtg<1:16>' to generate first and second frequency setting signals 'frqset<1:2>' and first and second voltage setting signals 'vltset<1:2>'.

Meanwhile, the low-pass filter 60 can filter the pump voltage Vpmp to generate a control voltage Vctrl in response to the first and second voltage setting signals 'vltset<1:2>'. In addition, the voltage controlled oscillator 70 can oscillate an output clock signal 'clk_out' by using the control voltage Vctrl in response to the first and second frequency setting signals 'frqset<1:2>'. Moreover, the second clock division unit 80 can divide a frequency of the output clock signal 'clk_out' at a predetermined division ratio to output the feed-back clock signal 'clk_fb'.

In FIG. 1, although it is shown that the frequency discrimination signals 'frqdtg<1:16>' are implemented by 16 signals, the number of signals is not limited thereto. For example, the first and second frequency setting signals 'frqset<1:2>' can be implemented as the frequency setting signal or the first and second voltage setting signals 'vltset<1:2>' can be implemented as the voltage setting signal.

In FIG. 1, a gain of the voltage controlled oscillator 70 can be set by generating the frequency setting signal and the voltage setting signal. Correspondingly, the first and second frequency setting signals 'frqset<1:2>' and the first and second voltage setting signals 'vltset<1:2>' that can be generated by the oscillator gain setting member 100 may be called an oscillator gain setting signal. For example, the oscillator gain setting member 100 can discriminate a frequency by performing an operation of sequentially delaying the input clock signal 'clk_in' after dividing the input clock 'clk_in' at a predetermined division ratio, and can generate the oscillator gain setting signal by using the frequency information.

In addition, the PLL circuit 200 oscillates the output clock signal 'clk_out' having a frequency corresponding to the oscillator gain setting signal in response to an input of the input clock signal 'clk_in'.

The phase detector 10 generates the pull-up control signal plup and the pull-down control signal 'pldn' by detecting a difference in phase between the input clock signal 'clk_in' and the feed-back clock signal 'clk_fb'. Then, the charge pump 20 can control the pumping voltage Vpmp in response to the pull-up control signal 'plup' and the pull-down control signal 'pldn'. For example, when the pull-up control signal 'plup' is enabled, the potential of the pumping voltage Vpmp can increase, whereas while the pull-down control signal 'pldn' is enabled, the potential of the pumping voltage Vpmp can decrease.

The first clock division unit 30 can divide the input clock signal at a predetermined division ratio (herein, 2) to generate the division clock signal 'clk_div'. Then, the frequency discrimination unit 40 can perform an operation of sequentially delaying the division clock signal 'clk_div' through a plurality of unit delayers to extract frequency information of the input clock 'clk_in'. The operation of the frequency discrimination unit 40 will hereinafter be described in detail.

The encoding unit 50 receives the first to sixteenth frequency discrimination signals 'frqdtg<1:16>' output from the frequency discrimination unit 40 to generate the first and second frequency setting signals 'frqset<1:2>' and the first and second voltage setting signals 'vltset<1:2>'. At this time, the first and second frequency setting signals 'frqset<1:2>' can have a value to select an initial frequency band of the output clock signal 'clk_out' in correspondence with the frequency of the input clock signal 'clk_in'. Similarly, the first and second voltage setting signals 'vltset<1:2>' can have a value to select an initial frequency band of the control voltage Vctrl in correspondence with the frequency of the input clock signal 'clk_in'.

The low-pass filter 60 can filter the pumping voltage Vpmp to generate the control voltage Vctrl in response to the first and second voltage setting signals 'Vltset<1:2>' having the characteristic thereof. Accordingly, the level of the control voltage Vctrl can be determined by logical values of the first and second voltage setting signals vltset<1:2>.

The voltage controlled oscillator 70 can generate the output clock signal 'clk_out' having a frequency that corresponds to logical values of the first and second frequency setting signals 'frqset<1:2>' having the characteristic thereof, and the level of the control voltage Vctrl. At this time, the voltage controlled oscillator 70 can set a reference frequency of the output clock signal 'clk_out' in correspondence with the level of the control voltage Vctrl and can change the frequency of the output clock signal 'clk_out' in correspondence with the logical values of the first and second frequency setting signals 'frqset<1:2>'. For example, the frequency of the output clock signal 'clk_out' can be determined by the logical values of the first and second frequency setting signals 'frqset<1:2>'. Accordingly, the gain of the voltage controlled oscillator 70 should be set to a low value. For example, the voltage controlled oscillator 70 should change the frequency of the output clock signal 'clk_out' by insensibly responding to variation in the level of the control voltage Vctrl. Adjusting the gain of the voltage controlled oscillator 70 to a low value can be performed by controlling resistance values or current amounts of internal elements.

Figure 2A:
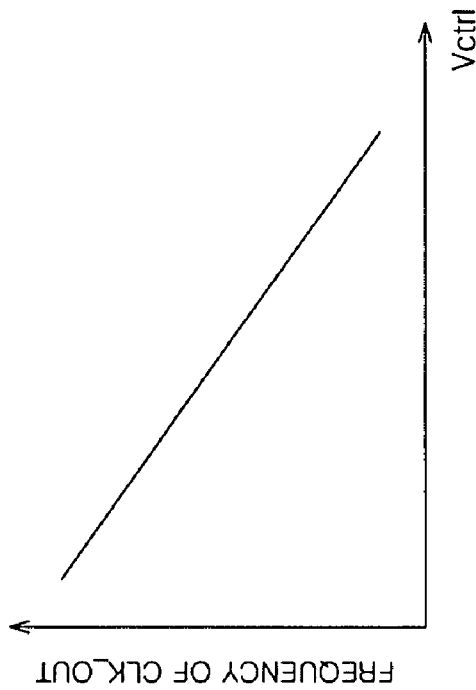

FIGS. 2A and 2B are graphs demonstrating an exemplary operation of the apparatus of FIG. 1 according to one embodiment. In FIG. 2A, the gain of the voltage controlled oscillator of the PLL circuit can be set to a steep slope. Thus, since the frequency of the output clock signal 'clk_out' sensitively responds to variation of the control voltage Vctrl, operational stability can deteriorate.

However, as shown in FIG. 2B, the gain of the voltage controlled oscillator 70 can be set to a gentle slope in the PLL circuit. In order to prevent a problem that an available frequency band is narrowed thereby, the available frequency band can be set to various cases (herein, 4 cases). Four line segments expressed by solid lines represent gains in the available frequency bands, respectively. The first and second frequency setting signals 'frqset<1:2>' can perform a function of selecting any one among the four available frequency bands shown in FIG. 2B.

With respect to the one selected available frequency, an initial voltage level of the control voltage Vctrl is set to various cases (herein, 4 cases). Line segments expressed by dotted lines represent the voltage level cases. The first and second voltage setting signals 'vltset<1:2>' select any one from the four initial voltage levels of the control voltage Vctrl.

Accordingly, the voltage controlled oscillator 70 of the PLL circuit can have a wide available frequency band while insensibly responding to the variation of the level of the control voltage Vctrl, thereby securing operational stability. The voltage controlled oscillator can provide short a locking time by setting the level of a frequency band of the output clock signal 'clk_out' and the level of the control voltage Vctrl at an initial stage.

Figure 3:
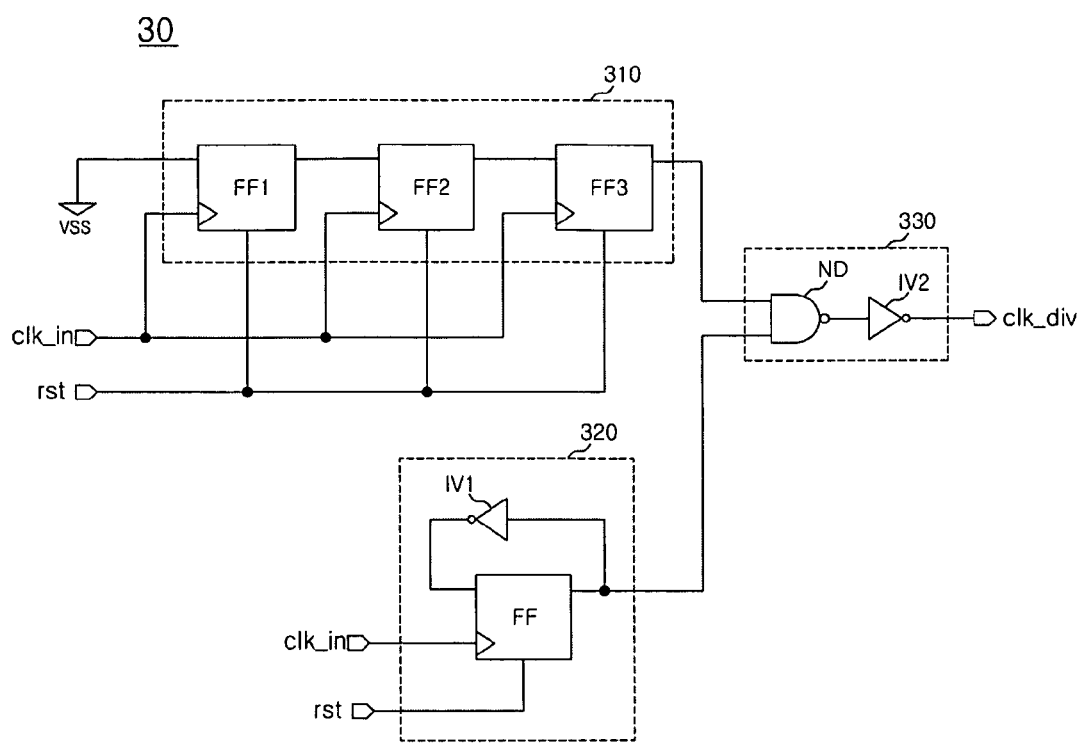
FIG. 3 is a schematic configuration diagram of an exemplary first clock divider capable of being implemented in the apparatus of FIG. 1 according to one embodiment.

FIG. 3 is a schematic configuration diagram of an exemplary first clock division unit 30 capable of being implemented in the apparatus of FIG. 1 according to one embodiment. In FIG. 3, the first clock division unit 30 can be configured to include a section setting unit 310, a division unit 320, and a signal combination unit 330. Here, the section setting unit 310 can define an effective section of the division clock signal 'clk_div' by receiving the input clock signal 'clk_in', and the division unit 320 can divide the input clock signal 'clk_in' into two. In addition, the signal combination unit 330 can output the division clock signal 'clk_div' by combining an output signal of the section setting unit 310 and an output signal of the division unit 320.

The section setting unit 310 can be initialized by a reset signal 'rst'. For example, the section setting unit 310 can include first, second, and third flip-flops FF1, FF2, and FF3 that can sequentially latch a ground voltage VSS in response to the input clock signal 'clk_in'.

Similarly, the division unit 320 can be initialized by the reset signal 'rst'. For example, the division unit 320 can include a fourth flip-flop FF4 that can latch a signal input to an input terminal thereof in response to the input clock signal 'clk_in'. In addition, the division unit 320 can include a first inverter IV1 that can invert an output signal of the fourth flip-flop FF4 to transmit the inverted output signal to the input terminal of the fourth flip-flop FF4.

The signal combination unit 330 can include a NAND gate ND that can receive the output signal of the section setting unit 310 and the output signal of the division unit 320. In addition, the signal combination unit 330 can include a second inverter IV2 that can output the division clock signal 'clk_div' by receiving the output signal of the NAND gate ND.

In FIG. 3, the section setting unit 310 can perform an operation of sequentially shifting the ground voltage VSS on each rising edge of the input clock signal 'clk_in'. Accordingly, when a third rising edge of the input clock signal 'clk_in' is reached, the potential of a level of the ground voltage VSS, i.e., low level potential, can be transmitted to the signal combination unit 330 and the division clock signal 'clk_div' can be at a low level. The functionality of the section setting unit 310 can be implemented so that the division clock signal 'clk_div' having a cycle twice more than the input clock signal 'clk_in' can be generated only for two cycles of the input clock signal 'clk_in'. Thus, it is possible to prevent an operational failure when the input clock signal 'clk_in' is implemented as a high frequency.

Figure 4:
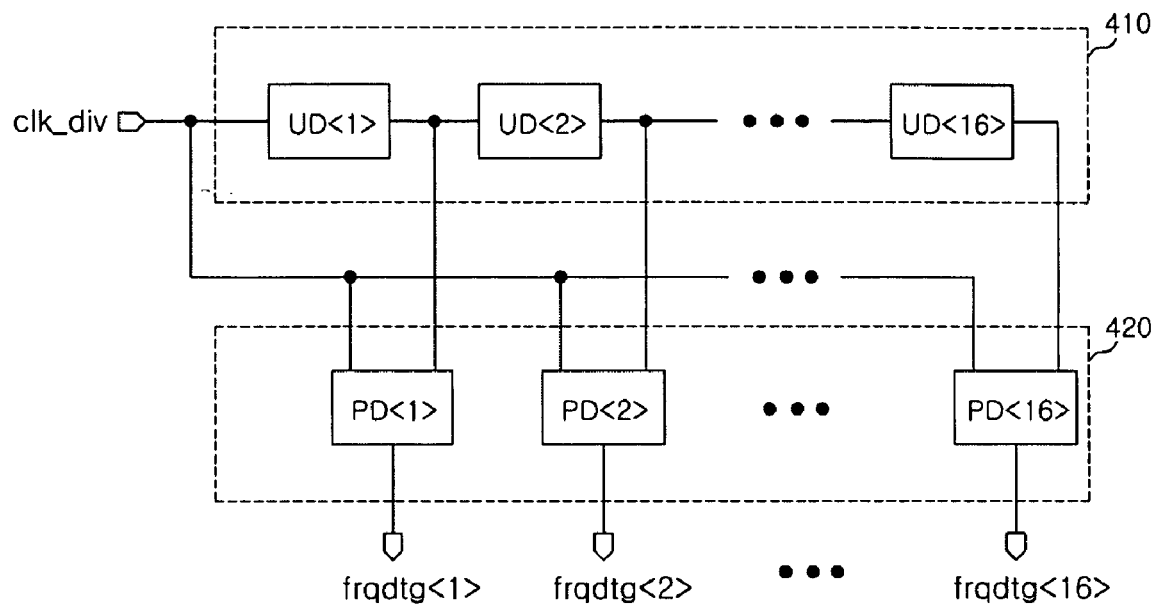
FIG. 4 is a schematic configuration diagram of an exemplary frequency discrimination unit capable of being implemented in the apparatus of FIG. 1 according to one embodiment.

FIG. 4 is a schematic configuration diagram of an exemplary frequency discrimination unit 40 capable of being implemented in the apparatus of FIG. 1 according to one embodiment. In FIG. 4, the frequency discrimination unit 40 can includes a delay unit 410 that can sequentially delay the division clock signal 'clk_div', and a phase comparison unit 420 that can generate the first to sixteenth frequency discrimination signals 'frqdtg<1:16>' by comparing 16 signals sequentially delayed in the delay unit 410 with phases of the division clock signal 'clk_div'.

For example, the delay unit 410 can include 16 unit delayers 'UD<1:16>' that can be connected in series to sequentially delay the division clock signal 'clk_div'. In addition, the phase comparison unit 420 can include 16 phase comparators 'PC<1:16>' that can output the first to sixteenth frequency discrimination signals 'frqdtg<1:16>' by receiving output signals of the division clock signal 'clk_div' and output signals of the 16 unit delayers 'UD<1:16>'.

A length of a high-level section of the division clock signal 'clk_div' can be equal to one cycle of the input clock signal 'clk_in'. When an operation of edge-triggering the division clock signal 'clk_div' is performed by using delayed signals by sequentially delaying the division clock signal 'clk_div', signals having a logical value equal to—1—can be successively generated and then signals having a logical value equal to—0—can be successively generated, whereby the first to sixteenth frequency discrimination signals 'frqdtg<1:16>' will be implemented. In addition, the cycle information of the input clock signal 'clk_in', i.e., frequency information, can be provided through the number of signals having the logical value equal to—1—. Consequently, the first to sixteenth frequency discrimination signals 'frqdtg<1:16>' can provide the frequency information of the input clock signal 'clk_in' through the logical value.

Figure 5:
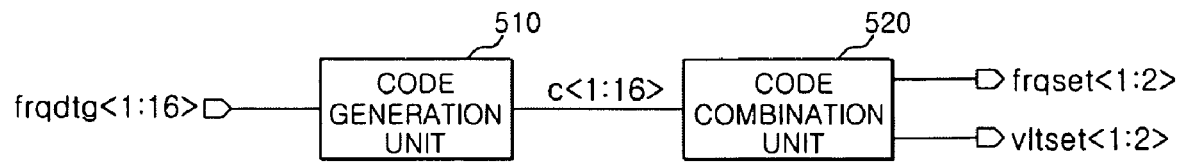
FIG. 5 is a schematic block diagram of an exemplary encoding unit capable of being implemented in the apparatus of FIG. 1 according to one embodiment.

FIG. 5 is a schematic block diagram of an exemplary encoding unit 50 capable of being implemented in the apparatus of FIG. 1 according to one embodiment. In FIG. 5, the encoding unit 50 can include a code generation unit 510 that can generate first to sixteenth codes 'c<1:16>' by combining the first to sixteenth frequency discrimination signals 'frqdtg<1:16>' with each other, and a code combination unit 520 that can generate the first and second frequency setting signals 'frqset<1:2>' and the first and second voltage setting signals 'vltset<1:2>' by combining the first to sixteenth codes 'c<1:16>' with each other.

Figure 6:
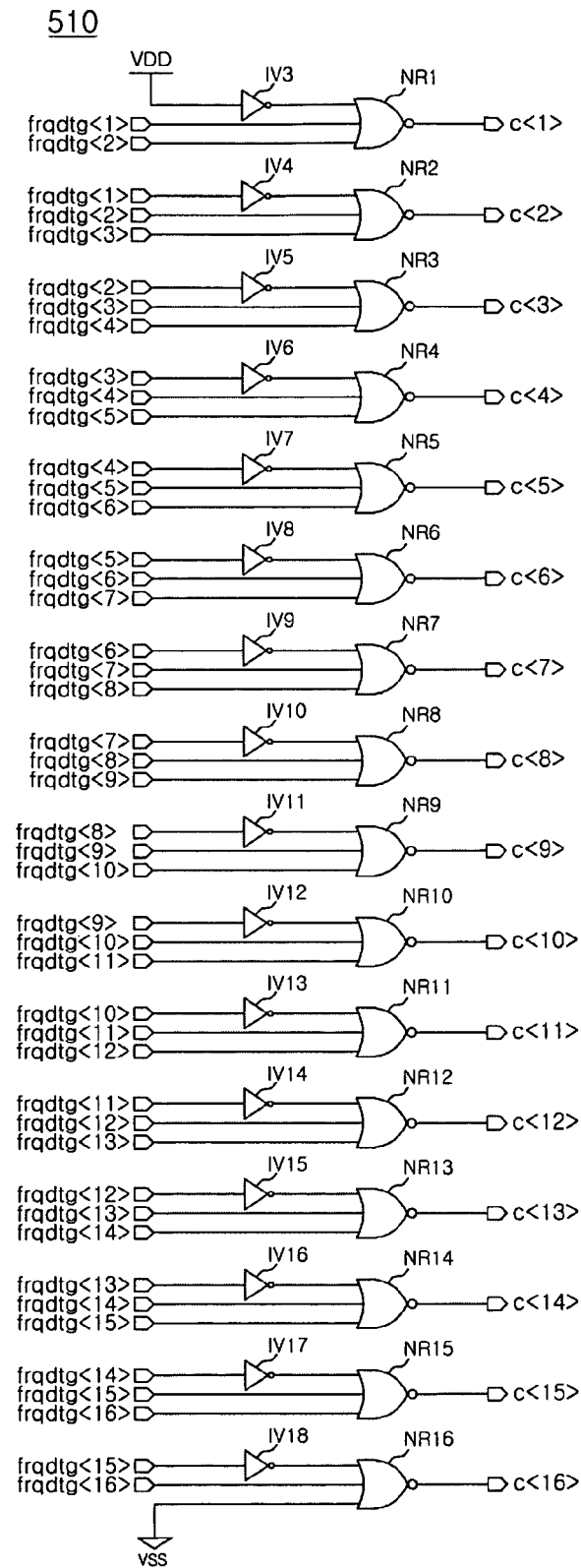
FIG. 6 is a schematic configuration diagram of an exemplary code generation unit capable of being implemented in the unit of FIG. 5 according to one embodiment.

FIG. 6 is a schematic configuration diagram of an exemplary code generation unit 510 capable of being implemented in the unit of FIG. 5 according to one embodiment. In FIG. 6, the code generation unit 510 can include a first to sixteenth NOR gate NR1~NR16. Here, the first NOR gate NR1 can output a first code 'c<1>' by receiving an external voltage VDD and the first and second frequency discrimination signals 'frqdtg<1:2>'. In addition, the second to fifteenth NOR gates NR2 to NR15 can output second to fifteenth codes 'c<2:15>' by sequentially receiving the first to sixteenth frequency discrimination signals 'frqdtg<1:16>' by three. Moreover, the sixteenth NOR gate NR16 can output a sixteenth code 'c<16>' by receiving fifteenth and sixteenth frequency discrimination signals 'frqdtg<15:16>' and the ground voltage VSS.

The code generation unit 510 can include a third inverter IV3, the first NOR gate NR1, a fourth inverter IV4, a second NOR gate NR2, a fifth inverter IV5, a third NOR gate NR3, a sixth inverter IV6, and a fourth NOR gate NR4. For example, the third inverter IV3 can receive the external voltage VDD, and the first NOR gate NR1 can output the first code 'c<1>' by receiving an output signal of the third inverter IV3 and the first and second frequency discrimination signals 'frqdtg<1:2>'. In addition, the fourth inverter IV4 can receive the first frequency discrimination signal 'frqdtg<1>', and the second NOR gate NR2 can output the second code 'c<2>' by receiving an output signal of the fourth inverter IV4 and the second and third frequency discrimination signals 'frqdtg<2:3>'. Furthermore, the fifth inverter IV5 can receive the second frequency discrimination signal 'frqdtg<2>', and the third NOR gate NR3 can output the third code 'c<3>' by receiving an output signal of the fifth inverter IV5 and the third and fourth frequency discrimination signals 'frqdtg<3:4>'. Moreover, the sixth inverter IV6 can receive the third frequency discrimination signal 'frqdtg<3>', and the fourth NOR gate NR4 can output the fourth code 'c<4>' by receiving an output signal of the sixth inverter IV6 and the fourth and fifth frequency discrimination signals 'frqdtg<4:5>'.

In FIG. 6, the code generation unit 510 can further include a seventh inverter IV7, a fifth NOR gate NR 5, an eighth inverter IV8, a sixth NOR gate NR6, a ninth inverter IV9, a seventh NOR gate NR7, a tenth inverter IV10, and an eighth NOR gate NR8. Here, the seventh inverter IV7 can receive the fourth frequency discrimination signal 'frqdtg<4>', and the fifth NOR gate NR 5 can output the fifth code 'c<5>' by receiving an output signal of the seventh inverter IV7 and the fifth and sixth frequency discrimination signals 'frqdtg<5:6>'. In addition, the eighth inverter IV8 can receive the fifth frequency discrimination signal 'frqdtg<5>', and the sixth NOR gate NR6 can output the sixth code 'c<6>' by receiving an output signal of the eighth inverter IV8 and the sixth and seventh frequency discrimination signals 'frqdtg<6:7>'. Furthermore, the ninth inverter IV9 can receive the sixth frequency discrimination signal 'frqdtg<6>', and the seventh NOR gate NR7 can output the seventh code 'c<7>' by receiving an output signal of the ninth inverter IV9 and the seventh and eighth frequency discrimination signals 'frqdtg<7:8>'. Moreover, the tenth inverter IV10 can receive the seventh frequency discrimination signal 'frqdtg<7>', and the eighth NOR gate NR8 can output the eighth code 'c<8>' by receiving an output signal of the tenth inverter IV10 and the eighth and ninth frequency discrimination signals 'frqdtg<10:11>'.

In addition, the code generation unit 510 can further include an eleventh inverter IV11, a ninth NOR gate NR 9, a twelfth inverter IV12, a tenth NOR gate NR10, a thirteenth inverter IV13, an eleventh NOR gate NR11, a fourteenth inverter IV14, and a twelfth NOR gate NR12. Here, the eleventh inverter IV11 can receive the eighth frequency discrimination signal 'frqdtg<8>', and the ninth NOR gate NR 9 can output the ninth code 'c<9>' by receiving an output signal of the eleventh inverter IV11 and the ninth and tenth frequency discrimination signals 'frqdtg<9:10>'. Moreover, the twelfth inverter IV12 can receive the ninth frequency discrimination signal 'frqdtg<9>', and the tenth NOR gate NR10 can output the tenth code 'c<10>' by receiving an output signal of the twelfth inverter IV12 and the tenth and eleventh frequency discrimination signals 'frqdtg<10:11>'. Furthermore, the thirteenth inverter IV13 can receive the tenth frequency discrimination signal 'frqdtg<10>', and the eleventh NOR gate NR11 can output the eleventh code 'c<11>' by receiving an output signal of the thirteenth inverter IV13 and the eleventh and twelfth frequency discrimination signals 'frqdtg<11:12>'. Finally, the fourteenth inverter IV14 can receive the eleventh frequency discrimination signal 'frqdtg<11>', and the twelfth NOR gate NR12 can output the twelfth code 'c<12>' by receiving an output signal of the fourteenth inverter IV14 and the twelfth and thirteenth frequency discrimination signals 'frqdtg<12:13>'.

Furthermore, the code generation unit 510 can include a fifteenth inverter IV15, a thirteenth NOR gate NR 13, a sixteenth inverter IV16, a fourteenth NOR gate NR14, a seventeenth inverter IV17, a fifteenth NOR gate NR15, an eighteenth inverter IV18, and a sixteenth NOR gate NR16. Here, the fifteenth inverter IV15 can receive the twelfth frequency discrimination signal 'frqdtg<12>', and the thirteenth NOR gate NR 13 can output the thirteenth code 'c<13>' by receiving an output signal of the fifteenth inverter IV15 and the thirteenth and fourteenth frequency discrimination signals 'frqdtg<13:14>. In addition, the sixteenth inverter IV16 can receive the thirteenth frequency discrimination signal 'frqdtg<13>', the fourteenth NOR gate NR14 can output the fourteenth code 'c<14>' by receiving an output signal of the sixteenth inverter IV16 and the fourteenth and fifteenth frequency discrimination signals 'frqdtg<14:15>', and the seventeenth inverter IV17 can receive the fourteenth frequency discrimination signal 'frqdtg<14>'. Moreover, the fifteenth NOR gate NR15 can output the fifteenth code 'c<15>' by receiving an output signal of the seventeenth inverter IV17 and the fifteenth and sixteenth frequency discrimination signals 'frqdtg<15:16>', the eighteenth inverter IV18 can receive the fifteenth frequency discrimination signal 'frqdtg<15>'; and the sixteenth NOR gate NR16 can output the sixteenth code 'c<16>' by receiving an output signal of the eighteenth inverter IV18 and the sixteenth frequency discrimination signal 'frqdtg<16>' and the ground voltage VSS.

Figure 7:
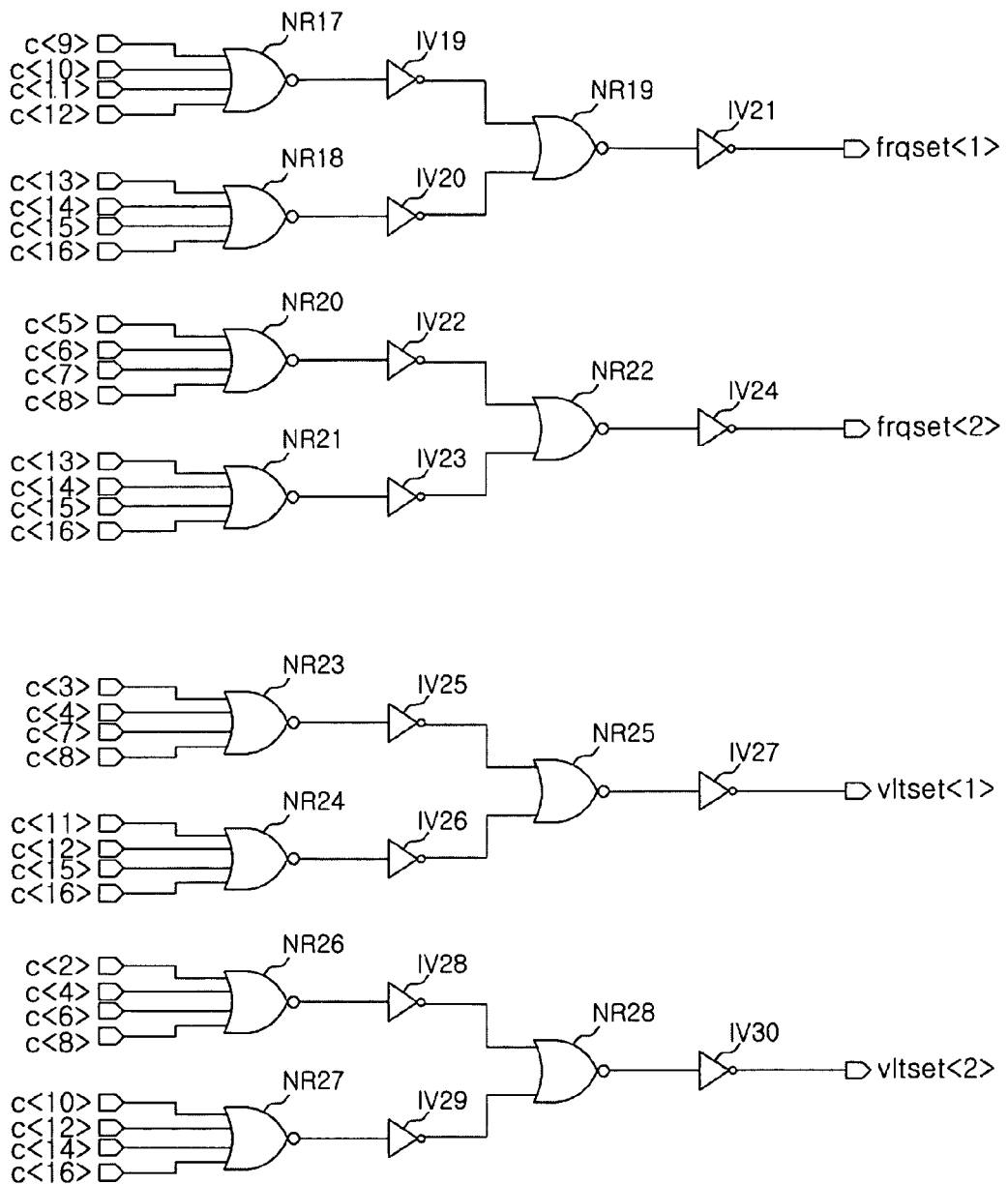
FIG. 7 is a schematic configuration diagram of an exemplary code combination unit capable of being implemented in the unit of FIG. 5 according to one embodiment.

FIG. 7 is a schematic configuration diagram of an exemplary code combination unit 520 capable of being implemented in the unit of FIG. 5 according to one embodiment. In FIG. 7, the code combination unit 520 can include a seventeenth NOR gate NR17, a nineteenth inverter IV19, an eighteenth NOR gate NR18, a twentieth inverter IV20, a nineteenth NOR gate NR19, and a twenty first inverter IV21. Here, the seventeenth NOR gate NR17 can receive the ninth to twelfth codes 'c<9:12>', and the nineteenth inverter IV19 can receive an output signal of the seventeenth NOR gate NR17. In addition, the eighteenth NOR gate NR18 can receive the thirteenth to sixteenth codes 'c<13:16>', and the twentieth inverter IV20 can receive an output signal of the eighteenth NOR gate NR18. Furthermore, the nineteenth NOR gate NR19 can receive an output signal of the nineteenth inverter IV19 and an output signal of the twentieth inverter IV20, and the twenty-first inverter IV21 can output the first frequency setting signal 'frqset<1>' by receiving the output signal of the nineteenth NOR gate NR19.

In addition, the code combination unit 520 can include a twentieth NOR gate NR20, a twenty-second inverter IV22, a twenty-first NOR gate NR21, a twenty-third inverter IV23, a twenty-second NOR gate NR22, and a twenty-fourth inverter IV24. Here, the twentieth NOR gate NR20 can receive the fifth to eighth codes 'c<5:8>', and the twenty-second inverter IV22 can receive an output signal of the twentieth NOR gate NR20. In addition, the twenty-first NOR gate NR21 can receive the thirteenth to sixteenth codes 'c<13:16>', and the twenty-third inverter IV23 can receive an output signal of the twenty-first NOR gate NR21. Moreover, the twenty-second NOR gate NR22 can receive an output signal of the twenty-second inverter IV22 and an output signal of the twenty-third inverter IV23, and the twenty-fourth inverter IV24 can output the second frequency setting signal 'frqset<2>' by receiving the output signal of the twenty-second NOR gate NR22.

In addition, the code combination unit 520 can include a twenty-third NOR gate NR23, a twenty-fifth inverter IV25, a twenty-fourth NOR gate NR24, a twenty-sixth inverter IV26, a twenty-fifth NOR gate NR25, and a twenty-seventh inverter IV27. Here, the twenty-third NOR gate NR23 can receive the third and fourth codes 'c<3:4>' and the seventh and eighth codes 'c<7:8>', and the twenty-fifth inverter IV25 can receive an output signal of the twenty-third NOR gate NR23. In addition, the twenty-fourth NOR gate NR24 can receive the eleventh and twelfth codes 'c<11:12>' and the fifteenth and sixteenth codes 'c<15:16>', and the twenty-sixth inverter IV26 can receive an output signal of the twenty-fourth NOR gate NR24. Moreover, the twenty-fifth NOR gate NR25 can receive an output signal of the twenty-fifth inverter IV25 and an output signal of the twenty-sixth inverter IV26, and the twenty-seventh inverter IV27 can output the first voltage setting signal 'vltset<1>' by receiving the output signal of the twenty-fifth NOR gate NR25.

In addition, the code combination unit 520 can include a twenty-sixth NOR gate NR26, a twenty-eighth inverter IV28, a twenty-seventh NOR gate NR26, a twenty-ninth inverter IV29, a twenty-eighth NOR gate NR28, and a thirtieth inverter IV30. Here, the twenty-sixth NOR gate NR26 can receive the second, fourth, sixth, and eighth codes 'c<2,4,6, 8>', and the twenty-eighth inverter IV28 can receive an output signal of the twenty-sixth NOR gate NR26. Furthermore, the twenty-seventh NOR gate NR26 can receive the tenth, twelfth, fourteenth, and sixteenth codes 'c<10,12,14,16>', and the twenty-ninth inverter IV29 can receive an output signal of the twenty-seventh NOR gate NR27. In addition, the twenty-eighth NOR gate NR28 can receive an output signal of the twenty-eighth inverter IV28 and an output signal of the twenty-ninth inverter IV29, and the thirtieth inverter IV30 can output the second voltage setting signal 'vltset<2>' by receiving the output signal of the twenty-eighth NOR gate NR28.

According to the encoding unit 50, the first and second frequency setting signals 'frqset<1:2>' and the first and second voltage setting signals 'vltset<1:2>' can contain the frequency information of the input clock signal transmitted from the first to sixteenth frequency discrimination signal 'frqdtg<1:16>'. Relationships of the first to sixteenth frequency discrimination signals 'frqdtg<1:16>', the first to sixteenth codes 'c<1:16>', the first and second frequency setting signals 'frqset<1:2>', and the first and second voltage setting signals 'vltset<1:2>' can be easily understood with reference to the following Table 1.

quency discrimination signals 'frqdtg<6:16>' are—0—, a logical value of the fifth code 'c<5>' is—1—and logical values of the rest codes are—0—. Accordingly, when the frequency information of the input clock signal 'clk_in' is transmitted to the code generation unit 510 from the frequency discrimination unit 40 by the first to sixteenth frequency discrimination signals 'frqdtg<1:16>', the code generation unit 510 can generate the first to sixteenth codes 'c<1:16>' by using the frequency information. Here, the code combination unit 520 can generate the first and second frequency setting signals 'frqset<1:2>' and the first and second voltage setting signals 'vltset<1:2>' in accordance with the logical values of the first to sixteenth codes 'c<1:16>'.

In FIG. 2B, when the logical values of the first and second frequency setting signals 'frqset<1:2>' are—0—and—0—, respectively, the input clock signal 'clk_in' can have the highest frequency. Thus, the uppermost line segment can be selected. In addition, when the logical values of the first and second frequency setting signals 'frqset<1:2>' are—1— and—1—, respectively, the input clock 'clk_in' can have the lowest frequency. Thus, the lowermost line segment can be selected.

As described above, on the line segments selected by the first and second frequency setting signals 'frqset<1:2>', the level of the control voltage Vctrl can be selected by the logical values of the first and second voltage setting signals 'vltset<1: 2>'.

Figure 8:
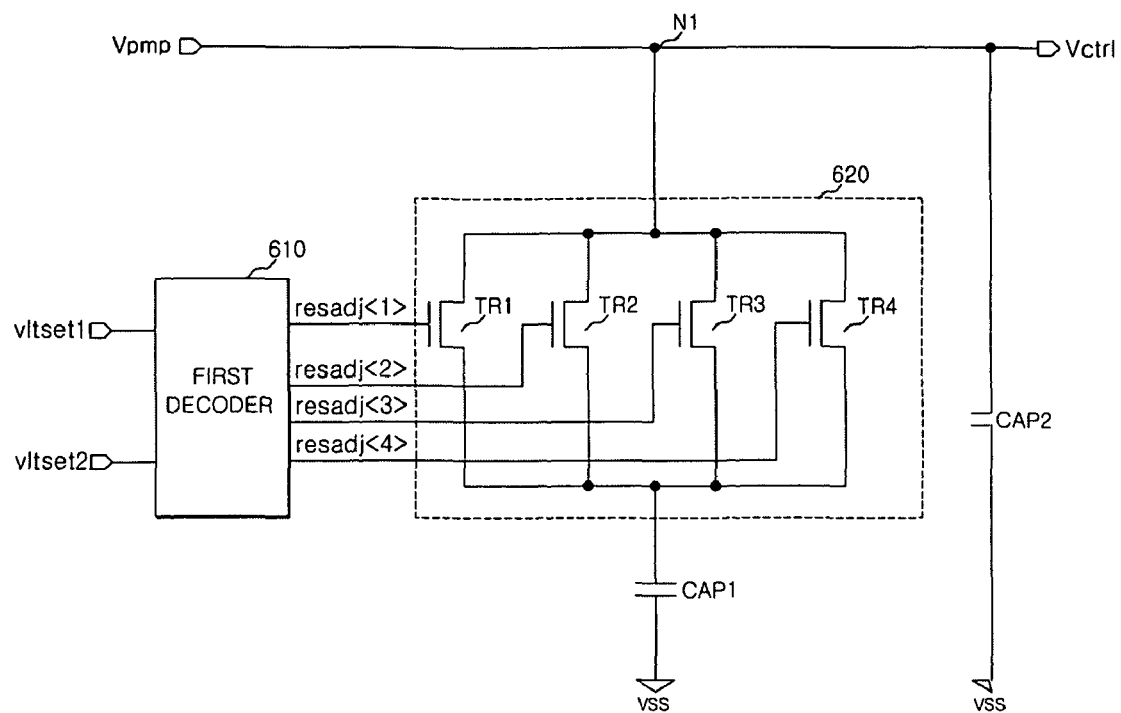
FIG. 8 is a schematic configuration diagram of an exemplary low-pass filter capable being implemented in the apparatus of FIG. 1 according to one embodiment.

FIG. 8 is a schematic configuration diagram of an exemplary low-pass filter 60 capable being implemented in the apparatus of FIG. 1 according to one embodiment. In FIG. 8, the low-pass filter 60 can includes a first decoder 610, a first node (N1), a variable resistor 620, a first capacitor CAP1, and a second capacitor CAP2. Here, the first decoder 610 can decode the first and second voltage setting signals 'vltset<1: 2>' to generate first to fourth resistance adjustment signals 'resadj<1:4>', and the first node (N1) can be supplied with the pumping voltage Vpmp and can output the control voltage

TABLE 1

| | | | | | | | | | | | | | | | | |
|---|---|---|---|---|---|---|---|---|---|---|---|---|---|---|---|---|
| c<1> | 1 | 0 | 0 | 0 | 0 | 0 | 0 | 0 | 0 | 0 | 0 | 0 | 0 | 0 | 0 | 0 |
| c<2> | 0 | 1 | 0 | 0 | 0 | 0 | 0 | 0 | 0 | 0 | 0 | 0 | 0 | 0 | 0 | 0 |
| c<3> | 0 | 0 | 1 | 0 | 0 | 0 | 0 | 0 | 0 | 0 | 0 | 0 | 0 | 0 | 0 | 0 |
| c<4> | 0 | 0 | 0 | 1 | 0 | 0 | 0 | 0 | 0 | 0 | 0 | 0 | 0 | 0 | 0 | 0 |
| c<5> | 0 | 0 | 0 | 0 | 1 | 0 | 0 | 0 | 0 | 0 | 0 | 0 | 0 | 0 | 0 | 0 |
| c<6> | 0 | 0 | 0 | 0 | 0 | 1 | 0 | 0 | 0 | 0 | 0 | 0 | 0 | 0 | 0 | 0 |
| c<7> | 0 | 0 | 0 | 0 | 0 | 0 | 1 | 0 | 0 | 0 | 0 | 0 | 0 | 0 | 0 | 0 |
| c<8> | 0 | 0 | 0 | 0 | 0 | 0 | 0 | 1 | 0 | 0 | 0 | 0 | 0 | 0 | 0 | 0 |
| c<9> | 0 | 0 | 0 | 0 | 0 | 0 | 0 | 0 | 1 | 0 | 0 | 0 | 0 | 0 | 0 | 0 |
| c<10> | 0 | 0 | 0 | 0 | 0 | 0 | 0 | 0 | 0 | 1 | 0 | 0 | 0 | 0 | 0 | 0 |
| c<11> | 0 | 0 | 0 | 0 | 0 | 0 | 0 | 0 | 0 | 0 | 1 | 0 | 0 | 0 | 0 | 0 |
| c<12> | 0 | 0 | 0 | 0 | 0 | 0 | 0 | 0 | 0 | 0 | 0 | 1 | 0 | 0 | 0 | 0 |
| c<13> | 0 | 0 | 0 | 0 | 0 | 0 | 0 | 0 | 0 | 0 | 0 | 0 | 1 | 0 | 0 | 0 |
| c<14> | 0 | 0 | 0 | 0 | 0 | 0 | 0 | 0 | 0 | 0 | 0 | 0 | 0 | 1 | 0 | 0 |
| c<15> | 0 | 0 | 0 | 0 | 0 | 0 | 0 | 0 | 0 | 0 | 0 | 0 | 0 | 0 | 1 | 0 |
| c<16> | 0 | 0 | 0 | 0 | 0 | 0 | 0 | 0 | 0 | 0 | 0 | 0 | 0 | 0 | 0 | 1 |
| frqset<1> | 0 | 0 | 0 | 0 | 0 | 0 | 0 | 1 | 1 | 1 | 1 | 1 | 1 | 1 | 1 | 1 |
| frqset<2> | 0 | 0 | 0 | 0 | 1 | 1 | 1 | 1 | 0 | 0 | 0 | 0 | 1 | 1 | 1 | 1 |
| vltset<1> | 0 | 0 | 1 | 1 | 0 | 0 | 1 | 1 | 0 | 0 | 1 | 1 | 0 | 0 | 1 | 1 |
| vltset<2> | 0 | 1 | 0 | 1 | 0 | 1 | 0 | 1 | 0 | 1 | 0 | 1 | 0 | 1 | 0 | 1 |

Positions of the signals having the logical value equal to —1—, which are included in the first to sixteenth codes 'c<1:16>', can be determined in accordance with the continuously number of signals having the logical value equal to—1—among the first to sixteenth frequency discrimination signal 'frqdtg<1:16>'. For example, when logical values of the first to fifth frequency discrimination signals 'frqdtg<1: 5>' are—1—and logical values of the sixth to sixteenth fre- Vctrl. In addition, the variable resistor 620 can be connected to the first node (N1) and can have a resistance value varying in response to the first to fourth resistance adjustment signals 'resadj<1:4>'. Moreover, the first capacitor CAP1 can be provided between the variable resistor 620 and a ground terminal, and the second capacitor CAP2 can be disposed parallel to the variable resistor 620 and the first capacitor CAP1.

The variable resistor 620 can include first to fourth transistors TR1 to TR4 provided in parallel to each other. Accordingly, the first to fourth resistance adjustment signals 'resadj<1:4>' can be input to gate terminals of the first to fourth transistors TR1 to TR4, respectively.

It presumed that when logical values of the first and second voltage setting signals 'vltset<1:2>' are—0—and—0—, respectively, the first resistance adjustment signal 'resadj<1>' can be enabled. In addition, when the logical values of the first and second voltage setting signals 'vltset<1:2>' are—0—and—1—, respectively, the second resistance adjustment signal 'resadj<2>' can be enabled. Moreover, when the logical values of the first and second voltage setting signals 'vltset<1:2>' are—1—and—0—, respectively, the third resistance adjustment signal 'resadj<3>' can be enabled. Furthermore, when the logical values of the first and second voltage setting signals 'vltset<1:2>' are—1—and—1—, respectively, the fourth resistance adjustment signal 'resadj<4>' can be enabled.

In FIG. 8, resistance values of the first to fourth transistors TR1 to TR4 can be set to different values, and the variable resistor 620 can have the largest resistance value when the first resistance adjustment signal 'resadj<1>' is enabled. In addition, the variable resistor 620 can have the smallest resistance value when the fourth resistance adjustment signal 'resadj<4>' is enabled. Accordingly, the resistance values of the variable resistor 620 can be different from each other by the first to fourth resistance adjustment signals 'resadj<1:4>' that are generated by decoding the first and second voltage setting signals 'vltset<1:2>'. Thus, an initial level of the control voltage Vctrl can be defined. For example, the PLL circuit can show shorter locking time by defining an initial gain of the voltage controlled oscillator 70 in accordance with the frequency of the input clock signal 'clk_in'.

Figure 9:
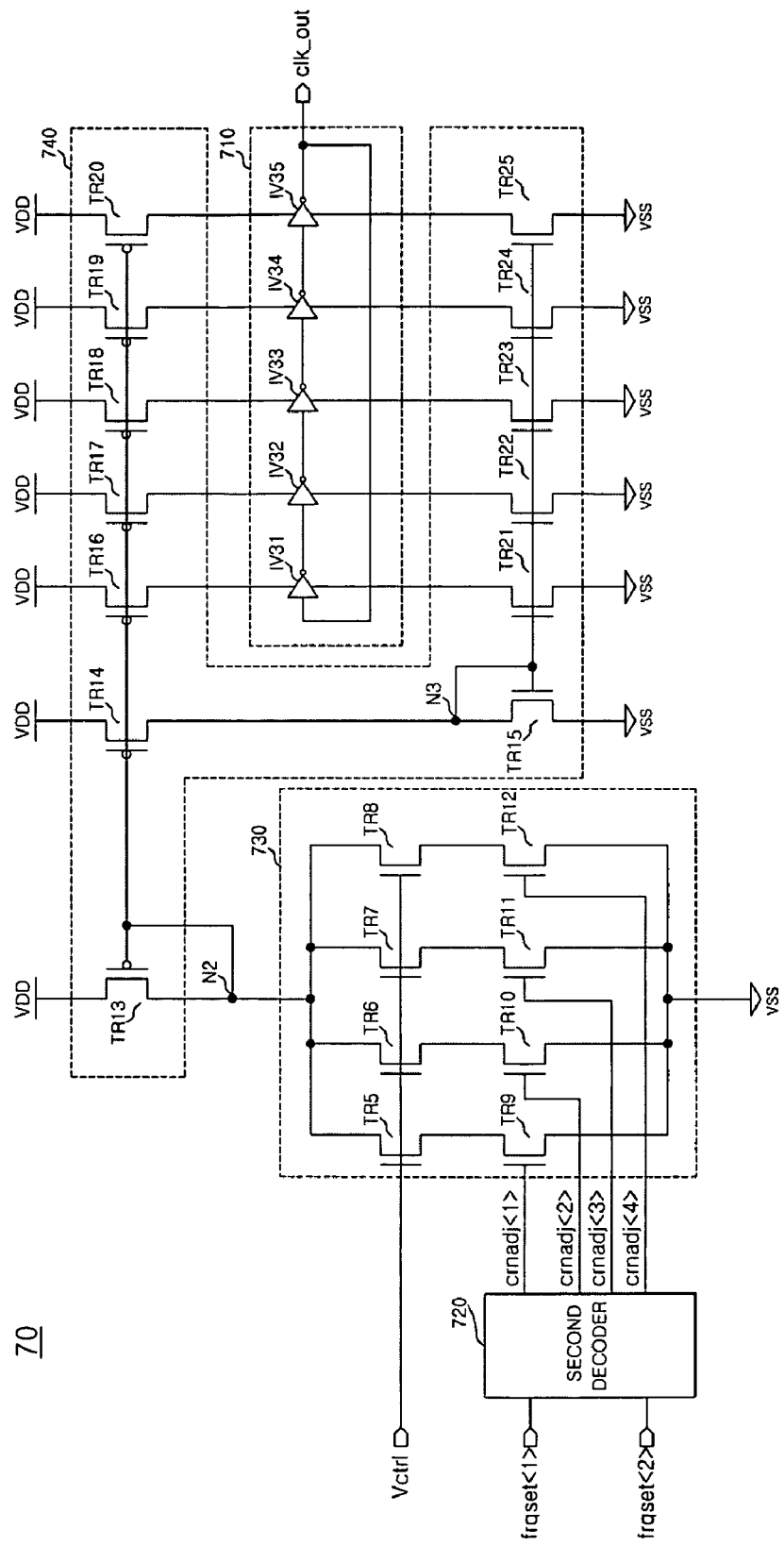
FIG. 9 is a schematic configuration diagram of an exemplary voltage controlled oscillator capable of being implemented in the apparatus of FIG. 1 according to one embodiment.

FIG. 9 is a schematic configuration diagram of an exemplary voltage controlled oscillator 70 capable of being implemented in the apparatus of FIG. 1 according to one embodiment. In FIG. 9, the voltage controlled oscillator 70 can include a second node (N2), an oscillation unit 710, a second decoder 720, a current amount control unit 730, and a speed control unit 740. Here, the oscillation unit 710 can oscillate the output clock signal 'clk_out' by being feed-backed the output clock 'clk_out', and the second decoder 720 can decode the first and second frequency setting signals 'frqset<1:2>' to generate first to fourth current amount adjustment signals 'crnadj<1:4>'. In addition, the current amount control unit 730 can control a current amount flowing on the second node (N2) in response to the first to fourth current amount adjustment signals 'crnadj<1:4>'. Furthermore, the speed control unit 740 can control the operation speed of the oscillation unit 710 in response to the current amount flowing on the second node (N2).

In FIG. 9, the oscillation unit 710 can be configured by using five inverter IV31 to IV35 that can be connected in series. Accordingly, the output clock signal 'clk_out' output from the thirty-fifth inverter IV35 can be feed-backed to the thirty first inverter IV31.

The current amount control unit 730 can include fifth to eighth transistors TR5 to TR8 that can be connected to the second node (N2) and can be arranged in parallel to each other, wherein gate terminals thereof can be supplied with the control voltage Vctrl. In addition, the current amount control unit 730 can include ninth to twelfth transistors TR9 to TR12 that can each be provided between the fifth to eighth transistors TR5 to TR8 and ground terminal, wherein the gate terminal thereof can be input with the first to fourth current amount adjustment signals 'crnadj<1:4>'.

The speed control unit 740 can include a thirteenth transistor TR13, a fourteenth transistor TR14, and a fifteenth transistor TR15. Here, the thirteenth transistor TR13 can have a gate terminal and a drain terminal connected to the second node (N2), and a source terminal supplied with the external voltage VDD. In addition, the fourteenth transistor TR14 can have a gate terminal connected to the second node (N2), a source terminal supplied with the external voltage VDD, and a drain terminal connected to a third node (N3). Furthermore, the fifteenth transistor TR15 can have a gate terminal and a drain terminal connected to the third node (N3), and a source terminal that can be grounded.

In addition, the speed control unit 740 can include sixteenth to twenty-fifth transistors TR16 to TR25. Here, the sixteenth to twentieth transistors TR16 to TR20 can have gate terminals thereof connected to the second node (N2), source terminals thereof supplied with the external voltage VDD, and drain terminals thereof connected to pull-up terminals of the thirty-first to thirty-fifth inverters IV31 to IV35. In addition, the twenty first to twenty fifth transistors TR21 to TR25 can have gate terminals thereof connected to the third node (N3), source terminals thereof can be grounded, and drain terminals thereof can be connected to pull-down terminals of the thirty-first to thirty-fifth inverters IV31 to IV35, respectively.

In FIG. 9, the first to fourth current amount adjustment signals 'crnadj<1:4>' can be generated in substantially the same manner as the first to fourth resistance adjustment signals 'resadj<1:4>'. For example, when logical values of the first and second frequency setting signals 'frqset<1:2>' are—0—and—0—, respectively, the first current amount adjustment signal 'crnadj<1>' can be enabled. When the first and second frequency setting signals 'frqset<1:2>' are—0—and—1—, respectively, the second current amount adjustment signal 'crnadj<2>' can be enabled. When the logical values of the first and second frequency setting signals 'frqset<1:2>' are—1—and—0—, respectively, the third current amount adjustment signal 'crnadj<3>' can be enabled. When the logical values of the first and second frequency setting signals 'frqset<1:2>' are—1—and—1—, respectively, the fourth current amount adjustment signal 'crnadj<4>' can be enabled.

Resistance values of the ninth to twelfth transistors TR9 to TR12 of the current amount control unit 730 can be set to different values, and the current amount flowing on the second node (N2) can be set to the largest value when the first current amount adjustment signal 'crnadj<1>' is enabled and the current amount flowing on the second node N2 should be set to the smallest value when the fourth current amount adjustment signal 'crnadj<4>'. The current amount control unit 730 primarily sets the current amount flowing on the second node (N2) by controlling a current amount passing through the fifth to eighth transistors TR5 to TR8 in response to the control voltage Vctrl. As described above, the current amount flowing on the second node (N2) can be additionally controlled by the first to fourth current amount adjustment signals 'crnadj<1:4>' generated by decoding the first and second frequency setting signals 'frqset<1:2>'.

When the current amount flowing on the second node (N2) increases, the current amount flowing on the third node (N3) can also increase. Accordingly, when the current amount flowing on the second node (N2) increases, a current amount supplied to the oscillation unit 710 through the sixteenth to twentieth transistors TR16 to TR20 of the speed control unit 740 and a current amount flowing out through the twenty-first to twenty-fifth transistors TR21 to TR25 of the speed control unit 740 can increase. Thus, the operation speed of the oscillation unit 710 can increase and the frequency of the output clock 'clk_out' can increase.

When the current amount flowing on the second node (N2) decreases, the current amount flowing on the third node (N3) can also decrease. Accordingly, when the current amount flowing on the second node (N2) decreases, the current amount supplied to the oscillation unit 710 through the sixteenth to twentieth transistors TR16 to TR20 of the speed control unit 740 and the current amount flowing out through the twenty-first to twenty-fifth transistors TR21 to TR25 of the speed control unit 740 can decrease. Thus, the operation speed of the oscillation unit 710 can decrease and the frequency of the output clock 'clk_out' can decrease.

Accordingly, it is possible to overcome the problem of narrowing of the available frequency band and the problem of extended locking time, which the PLL circuit can show shorter locking time by defining an initial gain of the voltage controlled oscillator 70 in accordance with the frequency of the input clock signal 'clk_in', which can be raised as a disadvantage of the voltage controlled oscillator having the small gain by defining the initial frequency band of the voltage controlled oscillator 70 in accordance with the frequency of the input clock signal 'clk_in'.

As described above, the PLL circuit can improve the operational stability by setting the gain of the voltage controlled oscillator to a small gain. The PLL circuit can have the available frequency band in substantially the same range as at the time of using the voltage controlled oscillator having the large gain by discriminating the frequency of the input clock signal and thus defining the initial frequency band of the output clock. The PLL circuit can have shorter locking time to setting the initial level of the control voltage in accordance with the frequency of the input clock signal, thereby supporting a high-speed operation of a semiconductor integrated circuit device more efficiently.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A phase synchronization apparatus, comprising:
    an oscillator gain setting member configured to discriminate a frequency by sequentially delaying an input clock signal after dividing the input clock signal at a predetermined division ratio and to generate an oscillator gain setting signal by using discriminated frequency information;
    a phase locked loop (PLL) circuit configured to oscillates output clock signal having a frequency corresponding to the oscillator gain setting signal in response to the input clock signal;
    wherein the oscillator gain setting signal includes a frequency setting signal and a voltage setting signal, and the oscillator gain setting member is configured to generate the frequency setting signal so as to select an initial frequency band of the output clock signal in response to a frequency of the input clock signal and to generate the voltage setting signal so as to select an initial voltage level of a control voltage in response to the frequency of the input clock signal.

2. The phase synchronization apparatus of claim 1, wherein the oscillator gain setting member includes:
    a clock division unit configured to generate a division clock signal by dividing the input clock signal at a predetermined division ratio;
    a frequency discrimination unit configured to generate a plurality of frequency discrimination signals containing the frequency information of the input clock signal by sequentially delaying the division clock signal; and
    an encoding unit configured to encode the frequency setting signal and the voltage setting signal by encoding the plurality of frequency discrimination signals.

3. The phase synchronization apparatus of claim 2, wherein the clock division unit includes:
    a section setting unit configured to define an effective section of the division clock signal by receiving the input clock signal;
    a division unit configured to divide the input clock signal at a predetermined division ratio; and
    a signal combination unit configured to output the division clock signal by combining an output signal of the section setting unit and an output signal of the division unit.

4. The phase synchronization apparatus of claim 2, wherein the frequency discrimination unit includes:
    a delay unit configured to sequentially delay the division clock signal; and
    a phase comparison unit configured to generate a plurality of frequency discrimination signals by comparing the plurality of signals sequentially delayed in the delay unit with phases of the division clock signal.

5. The phase synchronization apparatus of claim 2, wherein the encoding unit includes:
    a code generation unit configured to generate a plurality of codes by combining the plurality of frequency discrimination signals with each other; and
    a code combination unit configured to generate the frequency setting signal and the voltage setting signal by combining the plurality of codes with each other.

6. The phase synchronization apparatus of claim 1, wherein the PLL circuit includes:
    a phase detector configured to generate a pull-up control signal and a pull-down control signal by comparing a phase of the input clock signal with a phase of a feed-back clock signal;
    a charge pump configured to perform a voltage pumping operation to generate a pumping voltage in response to the pull-up control signal and the pull-down control signal;
    a low-pass filter configured to filter the pumping voltage to generate the control voltage in response to the voltage setting signal;
    a voltage controlled oscillator configured to oscillate the output clock signal in response to the frequency setting signal and the control voltage; and
    a clock division unit configured to divide the output clock signal at a predetermined ratio to output the feed-back clock signal.

7. The phase synchronization apparatus of claim 6, wherein the voltage setting signal includes a first voltage setting signal and a second voltage setting signal, and the low-pass filter includes:
    a decoder configured to generate a plurality of resistance adjustment signals by decoding the first voltage setting signal and the second voltage setting signal;
    a first node configured to be supplied with the pumping voltage and to output the control voltage;
    a variable resistor configured to be connected to the first node and having a resistance value varying in response to the plurality of resistance adjustment signals;

a first capacitor configured to be provided between the variable resistor and a ground terminal; and a second capacitor configured to be disposed in parallel to the variable resistor and the first capacitor.

8. The phase synchronization apparatus of claim 6, wherein the voltage controlled oscillator sets a reference frequency of the output clock signal in accordance with a level of the control voltage and changes the frequency of the output clock signal in response to the frequency setting signal.

9. The phase synchronization apparatus of claim 8, wherein the frequency setting signal includes a first frequency setting signal and a second frequency setting signal, and the voltage controlled oscillator includes:

a first node;

an oscillation unit configured to oscillates the output clock signal by being fed-backed with the output clock signal;

a decoder configured to generate a plurality of current amount adjustment signals by decoding the first frequency setting signal and the second frequency setting signal;

a current amount control unit configured to control a current amount flowing on the first node in response to the control voltage and the plurality of current amount adjustment signals; and a speed control unit configured to control an operation speed of the oscillation unit in response to the current amount flowing on the first node.

10. A phase synchronization apparatus, comprising:

a first clock division unit configured to divide an input clock signal at a predetermined division ratio to generate a division clock signal;

a frequency discrimination unit configured to perform an operation of sequentially delaying the division clock signal to generate a frequency discrimination signal containing frequency information of the input clock signal;

an encoding unit configured to encode the frequency discrimination signal to generate a frequency setting signal; and a voltage controlled oscillator configured to oscillate an output clock signal in response to the frequency setting signal and a control voltage.

11. The phase synchronization apparatus of claim 10, wherein the first clock division unit includes:

a section setting unit configured to define an effective section of the division clock signal by receiving the input clock signal;

a division unit configured to divide the input clock signal at the predetermined division ratio; and a signal combination unit configured to output the division clock signal by combining an output signal of the section setting unit with an output signal of the division unit.

12. The phase synchronization apparatus of claim 10, wherein the frequency discrimination unit includes:

a delay unit configured to sequentially delay the division clock signal; and a phase comparison unit configured to generate the plurality of frequency discrimination signals by comparing phases of the plurality of signals sequentially delayed in the delay unit with phases of the division clock signal.

13. The phase synchronization apparatus of claim 10, wherein the encoding unit generates the frequency setting signal configured to select an initial frequency band of the output clock signal in correspondence with a frequency of the input clock signal.

14. The phase synchronization apparatus of claim 13, wherein the encoding unit includes:

a code generation unit configured to generate a plurality of codes by combining the plurality of frequency discrimination signals with each other; and a code combination unit configured to generate the frequency setting signal by combining the plurality of codes with each other.

15. The phase synchronization apparatus of claim 10, wherein the voltage controlled oscillator sets a reference frequency of the output clock signal in accordance with a level of the control voltage and changes the frequency of the output clock signal in response to the frequency setting signal.

16. The phase synchronization apparatus of claim 15, wherein the frequency setting signal includes a first frequency setting signal and a second frequency setting signal, and the voltage controlled oscillator includes:

a first node;

an oscillation unit configured to oscillate the output clock signal by being fed-back with the output clock signal;

a decoder configured to generate a plurality of current amount adjustment signals by decoding the first frequency setting signal and the second frequency setting signal;

a current amount control unit configured to control a current amount flowing on the first node in response to the control voltage and the plurality of current amount adjustment signals; and a speed control unit configured to control an operation speed of the oscillation unit in response to the current amount flowing on the first node.

17. The phase synchronization apparatus of claim 13, wherein the encoding unit generates the voltage setting signal configured to select an initial voltage level of the control voltage in correspondence with a frequency of the input clock signal.

18. The phase synchronization apparatus of claim 17, further comprising a low-pass filter configured to filter a pumping voltage to generate the control voltage in response to the voltage setting signal.

19. The phase synchronization apparatus of claim 18, wherein the voltage setting signal includes a first voltage setting signal and a second voltage setting signal, and the low-pass filter includes:

a decoder configured to generate a plurality of resistance adjustment signals by decoding the first voltage setting signal and the second voltage setting signal;

a first node configured to be supplied with the pumping voltage and outputs the control voltage;

a variable resistor configured to be connected to the first node and having a resistance value varying in response to the plurality of resistance adjustment signals;

a first capacitor configured to be provided between the variable resistor and a ground terminal; and a second capacitor configured to be disposed in parallel to the variable resistor and the first capacitor.

20. The phase synchronization apparatus of claim 18, further comprising:

a second clock division unit configured to divide the output clock signal at a predetermined division ratio to output the feed-back clock signal;

a phase detector configured to generate a pull-up control signal and a pull-down control signal by comparing a phase of the input clock signal with a phase of the feed-back clock signal; and a charge pump configured to perform a voltage pumping operation to generate the pumping voltage in response to the pull-up control signal and the pull-down control signal.

21. A method for phase synchronization in a semiconductor device, comprising:
- dividing an input clock signal at a predetermined division ratio;
- discriminating a frequency by sequentially delaying the input clock signal;
- generating an oscillator gain setting signal using discriminated frequency information related to the sequentially delayed input clock signal; and
- generating output clock signal having a frequency corresponding to the oscillator gain setting signal in response to the input clock signal,
- wherein the oscillator gain setting signal includes a frequency setting signal and a voltage setting signal, and further comprising selecting an initial frequency band of the output clock signal based on the frequency setting signal and in response to a frequency of the input clock signal and selecting an initial voltage level of a control voltage based on the voltage setting signal and in response to the frequency of the input clock signal.

22. The method of claim 21, further comprising:
- generating a division clock signal by dividing the input clock signal at a predetermined division ratio;
- generating a plurality of frequency discrimination signals containing the frequency information of the input clock signal by sequentially delaying the division clock signal; and
- encoding the frequency setting signal and the voltage setting signal by encoding the plurality of frequency discrimination signals.

23. The method of claim 22, further comprising:
- defining an effective section of the division clock signal based on the input clock signal;
- dividing the input clock signal at a predetermined division ratio; and
- outputting the division clock signal by combining an output signal of the section setting unit and an output signal of the division unit.

24. The method of claim 22, further comprising:
- sequentially delaying the division clock signal; and
- generating a plurality of frequency discrimination signals by comparing the plurality of signals sequentially delayed in the delay unit with phases of the division clock signal.

25. The method of claim 22, further comprising:
- generating a plurality of codes by combining the plurality of frequency discrimination signals with each other; and
- generating the frequency setting signal and the voltage setting signal by combining the plurality of codes with each other.

* * * * *